United States Patent [19]

Shigihara et al.

[11] Patent Number: 5,177,749

[45] Date of Patent: Jan. 5, 1993

[54] SEMICONDUCTOR LASER DEVICE

[75] Inventors: Kimio Shigihara; Yutaka Nagai; Toshitaka Aoyagi, all of Itami, Japan

[73] Assignee: Mitsubishi Denki Kabushiki Kaisha, Tokyo, Japan

[21] Appl. No.: 794,503

[22] Filed: Nov. 19, 1991

Related U.S. Application Data

[62] Division of Ser. No. 693,318, Apr. 22, 1991.

[30] Foreign Application Priority Data

Aug. 28, 1990 [JP] Japan .................. 2-228570

[51] Int. Cl.⁵ .................. H01S 3/10
[52] U.S. Cl. .................. 372/20; 372/92; 372/99; 372/108
[58] Field of Search .................. 372/20, 23, 92, 44, 372/45, 49, 50, 99, 108, 105

[56] References Cited

U.S. PATENT DOCUMENTS 5,056,098  6/1991  Anthony et al. .................. 372/45

FOREIGN PATENT DOCUMENTS 61-242093  10/1986  Japan .
63-32985    2/1988  Japan .
63-32986    2/1988  Japan .
63-54794    3/1988  Japan .
63-312688  12/1988  Japan .
1-208884    8/1989  Japan .

OTHER PUBLICATIONS

Tokuda et al, "Widely Separated . . . Injection Current Control", Applied Physics Letters 49 (24), 1986, pp. 1629–1631.

Primary Examiner—James W. Davie
Attorney, Agent, or Firm—Leydig, Voit & Mayer

[57] ABSTRACT

A semiconductor laser device includes a semiconductor laser element having a quantum well structure active layer having n levels of quantum states (n≧2) from the first quantum level to the n-th quantum level in which the front facet reflectivity and the rear facet reflectivity are asymmetrical so that oscillation can occur at the n-th quantum level, a reflecting mirror having a reflectivity that causes oscillation of the semiconductor element to occur at a quantum level lower than the n-th quantum level, and a reflecting mirror moving unit for positioning the reflecting mirror in the neighborhood of the front facet or the rear facet of the semiconductor laser element. Therefore, a semiconductor laser device which can oscillate at two or more wavelengths with a simple construction is obtained.

8 Claims, 9 Drawing Sheets (FRONT FACET REFLECTIVITY) x (REAR FACET REFLECTIVITY)

41a — 40 — 41b

1

SEMICONDUCTOR LASER DEVICE

This application is a division of application Ser. No. 07/693,318, filed Apr. 22, 1991.

FIELD OF THE INVENTION

The present invention relates to a semiconductor laser device and, more particularly to a laser capable of oscillating two or more different wavelengths.

BACKGROUND OF THE INVENTIONS

FIG. 14(a) shows a structure of a prior art two-wavelength semiconductor laser device recited in, for example "Y. Tokuda et al., Appl. Phys. Lett. 49(24), pp. 1629-1631, (1986)". FIG. 14(b) shows the light output vs. current characteristics thereof and FIG. 14(c) shows an energy band diagram in the vicinity of the active layer thereof. In FIG. 14(a) on a p type or n type substrate 701, a p type or n type buffer layer 702, a p type or n type lower cladding layer 703, a p type or n type light confinement layer 704, an undoped quantum well active layer 705, an n type or p type light confinement layer 706, an n type or p type upper cladding layer 707, and an n type or p type contact layer 708 are successively disposed. A $SiO_2$ film 709 is disposed on a region on the upper cladding layer 707 where the stripe-shaped contact layer 708 is not formed. An electrode 710 is disposed on the rear surface of the substrate 701 and an electrode 711 is disposed on the contact layer 708 and the $SiO_2$ film 709. Reference numeral 712 designates an impurity diffusion region.

A description is given of the operation.

When a current is injected to the semiconductor laser device, first of all, spontaneous emission light (i in FIG. 14(b)) is emitted. When the current is increased, induced emission arises when the gain owing to the current injection and the total loss in the semiconductor laser are equal to each other (ii in FIG. 14(b)). Then, an oscillation owing to the transition of the quantum well at the bottom state (n=1) is obtained as shown in FIG. 14(c). When current is still further increased, the number of electrons and holes occupying the state of n=2 of the quantum well increases and an oscillation owing to the transition of n=2 shown in FIG. 14(c) is obtained (iii in FIG. 14(b)).

FIG. 8 shows a perspective view of a prior art array type semiconductor laser device which emits a plurality of different wavelengths, recited in, for example Japanese Patent publication No. 61-242093. In FIG. 8, on an n type GaAs substrate 110, an n type GaAs buffer layer 111, an n type $Al_xGa_{1-x}As$ (x=0.4) layer 112, an $Al_yGa_{1-y}As$ (y=0.2) layer 113, an $Al_zGa_{1-z}As$ (z=0.1 to 1) layer 114, an $Al_yGa_{1-y}As$ (y=0.2) layer 115, a p type $Al_xGa_{1-x}As$ (x=0.4) layer 116 and a p+ type GaAs layer 117 are successively disposed. Furthermore, a common n side electrode 118 is disposed on the rear surface of the substrate 110 and p side electrodes 119 and 120 are disposed on the p+ type GaAs layer 117. This array type semiconductor laser device is provided with a first laser light generating region 121 and a second laser light generating region 122, and a reflection coating 125 is disposed on the portion 123a of the first laser light generating region 121 at the device facet 124 while no reflection coating is present on the portion 123b of the second laser light generating region 122 at the device facet 124.

A description is given of the operation of this array type semiconductor laser device.

As disscussed above, since the reflection coating 125 is present on the facet 123a of the first laser light generating region 121 while no reflection coating is present on the facet 123b of the second laser light generating region 122, the optical loss in the first laser light generating region 121 is larger than that in the second laser light generating region 122. As a result, an oscillation of wavelength $\lambda_1$ at quantum level of n=1 occurs in the second laser light generating region 122 having less optical loss while an oscillation of wavelength $\lambda_2$ at quantum level of n=2 occurs in the first laser light generating region 121 having high optical loss. In this way, the optical loss in the respective laser light generating regions 121 and 122 are changed by changing the reflectivity at the respective laser facets 123a and 123b, whereby a monolithic device oscillating at a plurality of wavelengths is realized.

FIG. 9 shows a cross-sectional view of a prior art semiconductor laser device which emits a plurality of different wavelengths, recited in, for example Japanese Patent Publication No. 63-312688. In FIG. 9, on an n + type GaAs substrate 201, an n type $Al_zGa_{1-z}As$ cladding layer 202, an n type $Al_zGa_{1-z}As$ (z→y) parabolic type diffraction index distribution layer 203, an $Al_xGa_{1-x}As$ active layer 204a, an $Al_yGa_{1-y}As$ barrier layer 205, an $Al_xGa_{1-x}As$ active layer 204b, a p type $Al_zGa_{1-z}As$ (z→y) parabolic type diffraction index distribution layer 206 and a p type $Al_zGa_{1-z}As$ cladding layer 207 are successively disposed. An n side electrode 211 is disposed on the entirety of the rear surface of substrate 201. Furthermore, a p+ type GaAs cap layer 208a is disposed on the A region of the cladding layer 207 and a p+ type GaAs cap layer 208b is disposed on the B region of the cladding layer 207. P side electrodes 212a and 212b are disposed on the cap layers 208a and 208b, respectively. This semiconductor laser device comprises a quantum well active layer part A and a light absorption amount control part B, which controls the oscillation by applying an electric field to the control part B using the electrodes 211 and 212b.

FIG. 10 shows a perspective view of a prior art array type semiconductor device which emits a plurality of different wavelengths, recited in, for example Japanese Patent Publication No. 63-32986. In FIG. 10, on an n type GaAs substrate 305, an n type AlGaAs cladding layer 306, a quantum well active layer 307 and a p type AlGaAs cladding layer 308 are successively disposed, and p type GaAs contact layers 309a, 309b and 309c are disposed on the cladding layer 308 parallel with each other. Insulating films 310 are disposed at regions on the cladding layer 308 where the contact layers 309a, 309b and 309c are not disposed. An n side electrode 303 is disposed on the entirety of the rear surface of substrate 5 and p side electrodes 304a, 304b and 304c each having a different length are disposed on corresponding contact layers 309a, 309b and 309c, respectively. Current terminals 301, 302a, 302b and 302c are respectively connected to the n side electrode 303 and p side electrodes 304a, 304b and 304c. In addition, dotted line 311 shows a diffusion front of p type impurities.

It is well known that when a current is injected into the quantum well active layer and the injection carrier density is increased for band filling, as the energy level of the quantum level becomes higher, the gain becomes higher. In a laser array in which each laser element has the same cavity length, the length of the gain region is changed by changing the length of the electrode so that the loss is equivalently changed. When the laser has shorter electrode length, a higher gain is required for oscillation. Accordingly, as the length of the electrode becomes shorter, the energy level required to obtain a laser oscillation becomes higher. In this array type semiconductor laser device, the laser having a shorter electrode for injecting current oscillates at higher quantum level, whereby the oscillation wavelengths of respective lasers can be varied.

FIG. 11 shows a cross-sectional view of a semiconductor quantum well laser device which oscillates at a high quantum level with increasing the cavity loss, recited in, for example Japanese Patent Publication No. 63-54794. In FIG. 11, on an n type GaAs substrate 402, an n type AlGaAs cladding layer 403, a GaAs quantum well active layer 404, a p type AlGaAs cladding layer 405 and a p type GaAs contact layer 406 are successively disposed. An n side electrode 401 is disposed on the rear surface of substrate 402 and a p side electrode 407 is disposed on the contact layer 406 except for the absorption region 409.

In this semiconductor laser device, the absorption region 409 is provided at a part of the device to increase the loss of whole device, thereby enabling oscillation at higher energy level of the quantum well. When the size of this absorption region 409 is adjusted, it is possible to switch the wavelengths from n=1 to n=2 or to output both wavelengths of n=1 and n=2 at the same time by changing the injected current.

FIG. 12 shows a perspective view of a prior art semiconductor laser device in which the current injection electrode is divided into two parts and the current levels injected into the divided electrodes are controlled to enable oscillation at various quantum levels as, recited in Japanese Patent Publication No. 63-32985. In FIG. 12, on an n+ type GaAs substrate 505, an n type AlGaAs cladding layer 506, a quantum well active layer 507, a p type AlGaAs cladding layer 508 and a p type GaAs contact layer 509 are successively disposed. An n side electrode 503 is disposed on the rear surface of the substrate 505 and p side electrodes 504A and 504B are disposed on the contact layer 509. Current terminals 501, 502A and 502B are connected to these electrodes 503, 504A and 504B, respectively. In addition, dotted line 513 shows a diffusion front of p type impurities.

In this semiconductor laser device, the quantity of injection current from the electrode 504B is changed to control whether the oscillation occurs at the quantum level of n=1 or the quantum level of n=2 in the quantum well active layer 507. That is, when current is not injected into the electrode 504B, oscillation does not occur at a gain for the quantum level of n=1. By increasing the quantity of current injected to the electrode 504A, the gain for the quantum level of n=2 is increased and a laser oscillation occurs at a wavelength corresponding to the quantum level of n=2. When current is supplied to the electrode 504B in this state, the loss inside the laser element decreases and the gain for the quantum level of n=1 exceeds the loss, and then a laser oscillation occurs at a wavelength corresponding to the quantum level of n=1. In this conventional device, the current level supplied to the divided electrode is controlled, whereby oscillations at a plurality of wavelengths are realized.

FIG. 13 shows a prior art semiconductor laser device in which the oscillation wavelength is varied by varying the refractive index of an electro-optic crystal provided at the laser facet, recited in Japanese Patent Publication No. 1-208884. In FIG. 13, a reflecting mirror 602 is provided at one facet of a laser diode 601 and an electro-optic crystal 603 is provided at the other facet. A control circuit 604 for controlling the refractive index of the electro-optic crystal 603 is connected to the electro-optic crystal 603.

In this semiconductor laser device, the oscillation wavelength is determined by the oscillation mode of the laser diode 601 and the oscillation mode of the electro-optic crystal 603. The oscillation mode of the electro-optic crystal 603 can be varied by a voltage is applied to the electro-optic crystal 603 by the control circuit 604 to change the refractive index of the electro-optical crystal 603, whereby the oscillation wavelength of the laser can be varied.

The prior art semiconductor laser devices capable of oscillating at two or more wavelengths are constructed so that the oscillation wavelength is varied by varying the current injected or a wavelength controlling region formed integrally with the laser element so that oscillations occur at different wavelengths in different light emitting regions of the array type laser device. In such a laser device, there is no element separate from the semiconductor laser element to make the semiconductor laser element oscillate a different wavelength.

SUMMARY OF THE INVENTION

It is an object of the present invention to provide a multi-wavelength semiconductor laser device capable of oscillating at two or more wavelengths and producing a desired light output at a respective wavelength by providing an element separat from the semiconductor laser element.

Another object of the present invention is to provide a multi-wavelength oscillation semiconductor laser device capable of changing wavelengths at high speed.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with an aspect of the present invention, a semiconductor laser device includes a semiconductor laser element having an active layer comprising a quantum well structure or a multi-quantum well structure which allows n levels of quantum states ($n \geq 2$) from the first quantum level to the n-th quantum level, in which the front facet reflectivity and the rear facet reflectivity are made asymetrical or low so that an oscillation occurs at the n-th quantum level, a reflecting mirror having a reflectivity which enables an oscillation at a quantum level lower than the n-th quantum level, and a reflecting mirror moving means for varying the oscillation wavelength of the semiconductor laser element by arranging the reflecting mirror in the neighborhood of the front facet or rear facet of the semiconductor laser element. Therefore, a semiconductor laser device which oscillates at a desired light output at two or more wavelengths by quite a simple construction can be realized.

In accordance with another aspect of the present invention, a semiconductor laser device includes a semiconductor laser element having an active layer comprising a quantum well structure or a multi-quantum well structure which allows n levels of quantum states (n≧2) from the first quantum level to the n-th quantum level, in which the front facet reflectivity and the rear facet reflectivity are made asymmetric or low so that oscillation occurs at the n-th quantum level, a reflecting mirror element comprising a material the refractive index of which varies according to the injection of carriers or the application of an electric field arranged in the neighborhood of the front facet or rear facet of the semiconductor laser element, the reflectivity varying with the variation in the refractive index, so that the semiconductor laser element oscillates at an arbitrary quantum level from the first quantum level to the n-th quantum level. Therefore, oscillations at two or more wavelengths are obtained with a simple construction and these wavelengths can be switched at high speed.

DETAILED DESCRIPTION OF THE PREFERRED EMBODIMENT

Embodiments of the present invention will be described in detail with reference to the drawings.

Figure 1:
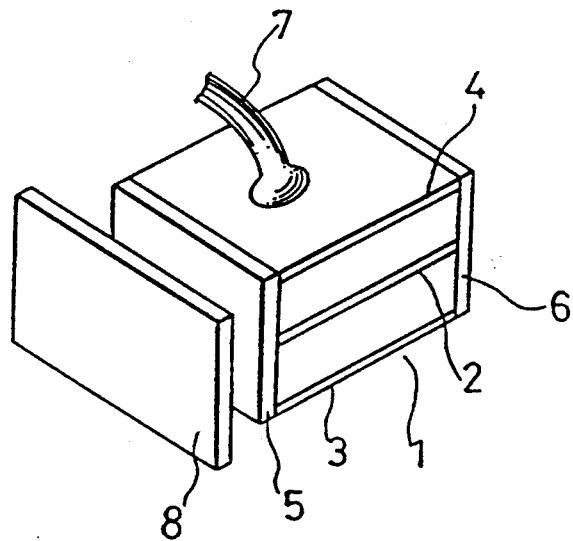
FIG. 1 is a perspective view showing a structure of a semiconductor laser device in accordance with a first embodiment of the present invention.

FIG. 1 shows a semiconductor laser device in accordance with a first embodiment of the present invention. In FIG. 1, reference numeral 1 designates a semiconductor laser element having a quantum well or multi-quantum well active layer having two or more quantum states. A quantum well or multi-quantum well active layer 2 is disposed at the center of the laser element 1. A lower side electrode 3 is disposed on the bottom surface of the semiconductor laser element 1 and an upper side electrode 4 is disposed on the upper surface of the semiconductor laser element 1. A film 5 of low reflectivity or non-reflectivity (AR film) or predetermined reflectivity Rf is disposed at the front facet of the semiconductor laser element 1. A film 6 of high reflectivity or predetermined reflectivity rf is disposed at the rear facet of the semiconductor laser element 1. A reflecting mirror 8 of reflectivity Rm is disposed in the neighborhood of the front facet of the semiconductor laser element 1. This mirror 8 is arranged in the neighborhood of the front facet of the semiconductor laser element 1 or removed therefrom by a driving mechanism (not shown). A metal wires 7 for injecting current is disposed on the upper side electrode 4. This semiconductor laser element 1 is mounted on a conductive base (not shown) and electric current flows from the metal wires 7 to the conductive base through the laser element 1. In FIG. 1, layers other than the active layer 2 which constitute the laser structure of the laser element 1 are not shown for simplification.

A semiconductor laser device in accordance with a first embodiment of the present invention will be described in detail hereinafter. For simplification, oscillations at a wavelength corresponding to the bottom level (n=1) and at a wavelength corresponding to the next level (n=2) are considered. The laser oscillation conditions for the n=1 level and the n=2 level are represented in the following formulae (1) and (2).

$$gth_1 = a_{i1} + \frac{1}{2L} l_n \frac{1}{Rf} \cdot \frac{1}{Rr} \quad (1)$$

$$gth_2 = a_{i2} + \frac{1}{2L} l_n \frac{1}{Rf} \cdot \frac{1}{Rr} \quad (2)$$

Here, gth$_1$ and gth$_2$ are threshold gains required for respective levels, $\alpha_{i1}$ and $\alpha_{i2}$ are internal losses of the semiconductor laser element corresponding to the wavelengths of the respective levels, L is the cavity length of the semiconductor laser, and Rf and Rr are the front facet reflectivity and a rear facet reflectivity of the semiconductor laser, respectively. Although Rf and Rr vary in accordance with the wavelengths of, it is assumed that they are equal because the wavelengths are close to each other.

Figure 2A:
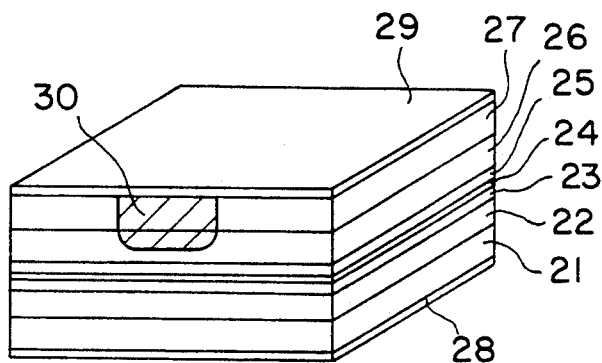
FIG. 2(a) is a perspective view of a structure of a semiconductor laser device
Figure 2B:
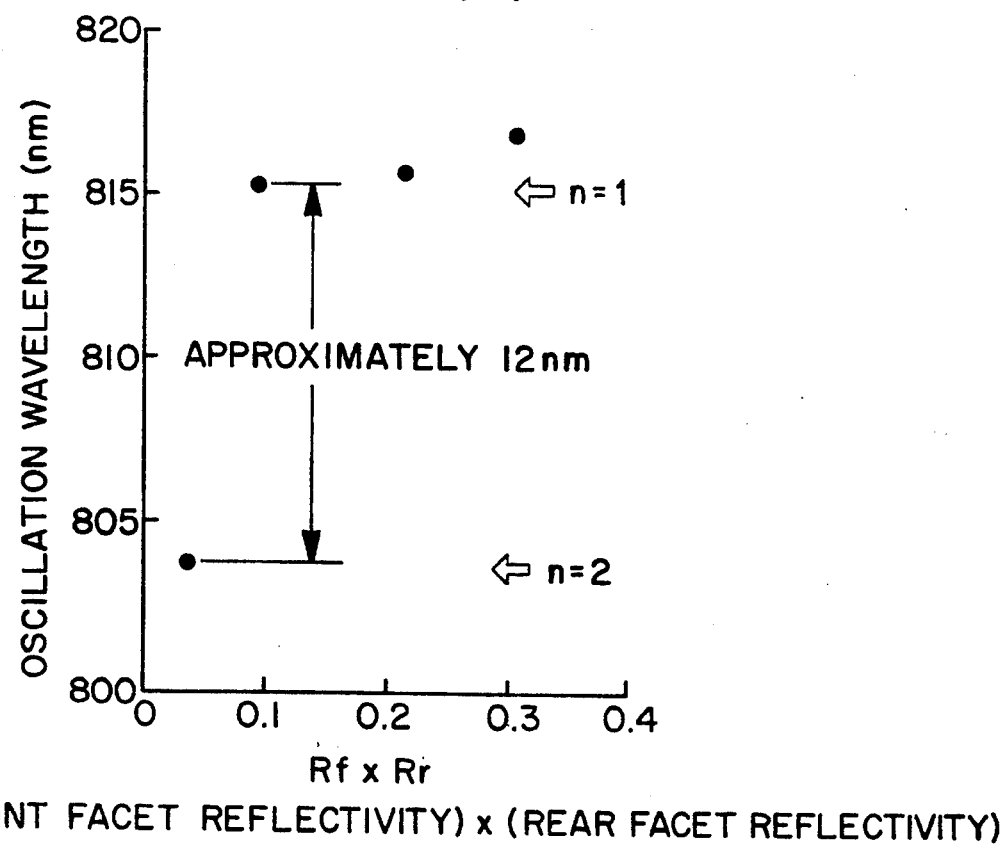
FIG. 2(b) is a graph of and an experimental result.

FIG. 2(a) shows a structure of a planar stripe semiconductor laser used in an experiment for explaining the operation of this embodiment and FIG. 2(b) shows a graph for confirming the change in the oscillation wavelength when the reflectivity of the both facets of the semiconductor laser device of FIG. 2(a) are varied. In the semiconductor laser device of FIG. 2(a), the active layer is an AlGaAs quantum well layer about 150 angstroms thick. As confirmed in FIG. 2(b), when the product of the front facet reflectivity and the rear facet reflectivity exceeds some value (about 0.07 in the figure), oscillation occurs at a long wavelength corresponding to n=1. When the product is below that value, oscillation occurs at short wavelength corresponding to n=2. This value is a threshold reflectivity Rth$_{1,2}$ the state of n=1 and the state of n=2.

Figure 3A:
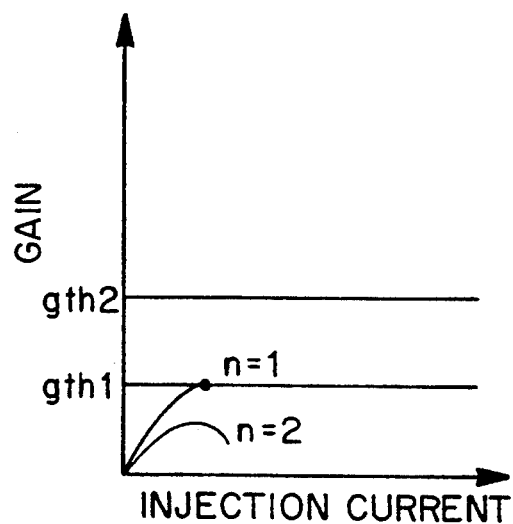
FIGS. 3(a)-3(b) are diagrams showing the relation between the injection current and the gain in respective quantum levels when the reflectivity to the facet of the laser element (mirror loss at the facet) is varied.
Figure 3B:
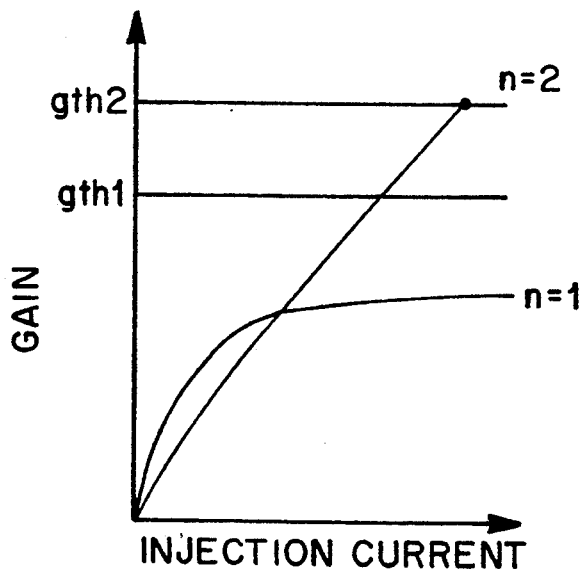

FIG. 3(a) shows a case where Rf·Rr>Rth$_{1,2}$. In this case, when the injection current is increased, the state of n=1 first reaches the threshold gain gth$_1$ and an oscillation occurs for the state of n=1. On the other hand, as shown in FIG. 3(b), in a case where Rf·Rr<Rth$_{1,2}$, the threshold gains gth$_1$ and gth$_2$ becomes large and when the injection current is increased, the gain for the state of n=1 is saturated and does not reach the threshold gain gth$_1$. On the other hand, the gain for the state of n=2 is not saturated and reaches the threshold gain gth$_2$, and then the laser oscillates at the state of n=2.

The first embodiment of the present invention utilizes this principle. In this embodiment, the reflectivity Rf of the front facet reflecting film 5 and the reflectivity Rr of the rear facet reflecting film 6 of the semiconductor laser element 1 are established to satisfy Rf·Rr<Rth$_{1,2}$, and a mirror 8 of reflectivity Rm is arranged in the neighborhood of the front facet of the semiconductor laser element 1. Here, Rm is selected to approximately satisfy Rm·Rr>Rth$_{1,2}$. In this case, when the mirror 8 is provided, an oscillation occurs at a long wavelength for the state of n=1 and when the mirror 8 is not provided, oscillation occurs at short wavelength for n=2 state. By moving this mirror 8 at high speed, it is possible to perform wavelength switching quickly. Here, Rf, Rr and Rm can be arbitrarily set as long as they satisfy the above condition.

Figure 4:
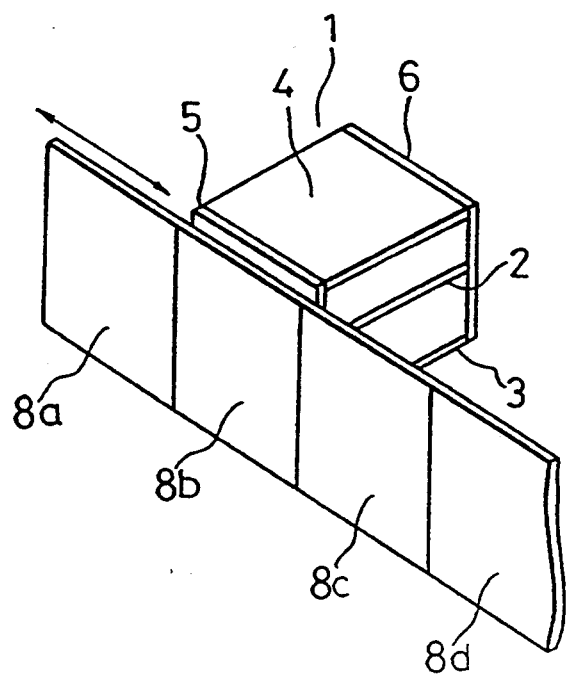
FIG. 4 is a perspective view showing an alternative of the first embodiment of the present invention.

FIG. 4 shows a semiconductor laser device as an alternative of the first embodiment. This laser device oscillates at three or more different wavelengths.

In the laser element 1 of this laser device, it is assumed that i quantum levels of or more are allowed. Reference numerals $8a$, $8b$, $8c$, $8d$ ... designate mirrors of reflectivity $Rm_{i-1}$, $Rm_{i-2}$, $Rm_{i-3}$ ... which are arranged continuously in a straight line and are slidable. When the threshold reflectivities between the state of n=i and the state of n=i−1, between the state of n=i−1 and the state of n=i−2, between the state of n=i−2 and the state of n=i−3 ... are $Rth_{i-1,i}$, $Rth_{i-2,i-1}$, $Rth_{i-3,i-2}$ ..., respectively, the reflectivity of respective mirrors $Rm_{i-1}$, $Rm_{i-2}$, $Rm_{i-3}$ ... are selected to satisfy the following formula.

$$Rm_{i-1} \cdot Rr < Rth_{i-1,i}$$
$$Rth_{i-1,i} < Rm_{i-2} Rr < Rth_{i-2,i-1}$$
$$Rth_{i-2,i-1} < Rm_{i-3} \cdot Rr < Rth_{i-3,i-2}$$

When there is no mirror, oscillation occurs at the highest level of n=i. When mirrors $8a$, $8b$, $8c$ ... of reflectivities $Rm_{i-1}$, $Rm_{i-2}$, $Rm_{i-3}$ ... are arranged in the neighborhood of the front facet of the laser element 1, oscillations at the levels for n=i−1, the n=i−2, the n=i−3 ... are obtained, respectively.

Since these mirrors are slidable and easily moved, oscillations for the level n=1 to the level of n=i are easily obtained by moving the mirrors. In the figure, although the mirrors are arranged in a straight line and are slidable, they can be arranged circularly and rotated.

A second embodiment of the present invention will be described hereinafter.

Figure 5:
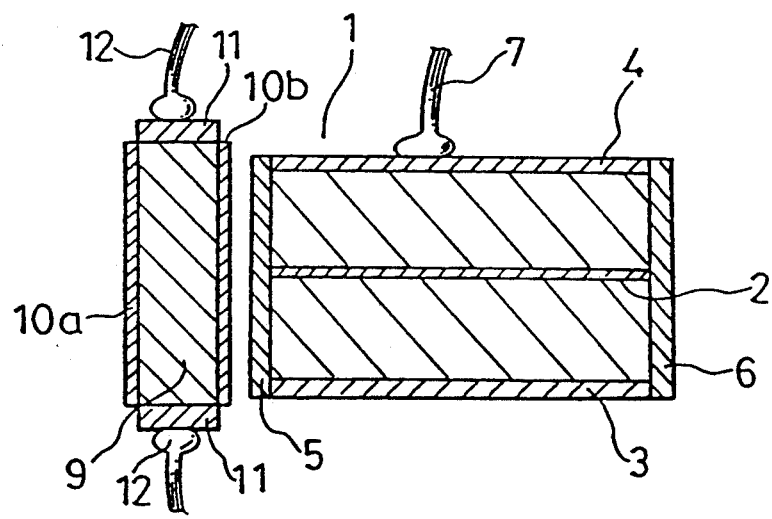
FIG. 5 is a perspective view showing a structure of a semiconductor laser device in accordance with a second embodiment of the present invention.

FIG. 5 shows a semiconductor laser device in accordance with a second embodiment of the present invention. In FIG. 5, the same reference numerals as those shown in FIG. 1 designate the same or corresponding parts. The front facet and the rear facet of the semiconductor element 1 are asymmetrically coated by the low reflectivity film 5 and the high reflectivity film 6, respectively. A semiconductor plate 9, both surfaces of which are coated with anti-reflectivity films or low reflecting films $10a$ and $10b$ to make the semiconductor plate 9 non-reflecting of low reflecting current is injected, is arranged in the neighborhood of the low reflectivity film 5 of the laser element 1.

The semiconductor plate 9 is of p type or n type or undoped, electrodes 11 for injecting carriers are attached thereto, and charge carrier injection metal wiring 12 are connected to the electrode 11.

The semiconductor laser device of this second embodiment utilizes the change in refractive index due to carrier injection in the semiconductor plate 9 in order to electrically vary the reflectivity. The semiconductor laser element 1 has a quantum well or multi-quantum well active layer 2 which allows quantum states of two or more quantum levels similarly as the first embodiment. Here, the reflectivity of the front facet reflecting film 5 is Rf and the reflectivity of the rear facet reflecting film 6 is Rr and these reflectivities satisfy $Rf \cdot Rr < Rth_{1,2}$. As described above, films $10a$ and $10b$ which make the semiconductor plate 9 non-reflecting or of low reflectivity in a state where current is injected into the semiconductor plate 9 are present on the surfaces of the semiconductor plate 9. Accordingly, when carriers are injected into the semiconductor plate 9, light does not return to the semiconductor laser and an oscillation of short wavelength of the state of n=2 is obtained.

On the other hand, when no current is injected into the semiconductor plate 9, the refractive index becomes large as compared with when current is injected. Then, the reflection from the semiconductor plate 9 becomes large, thereby producing an oscillation of long wavelength corresponding the state n=1.

Figure 7A:
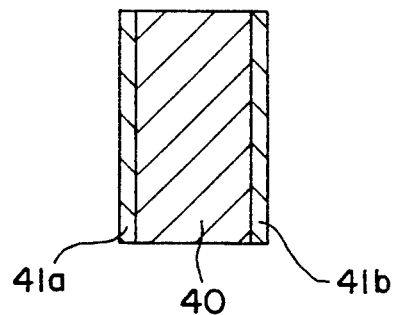
FIGS. 7(a)-7(b) are diagrams explaining the second embodiment of the present invention.
Figure 7B:
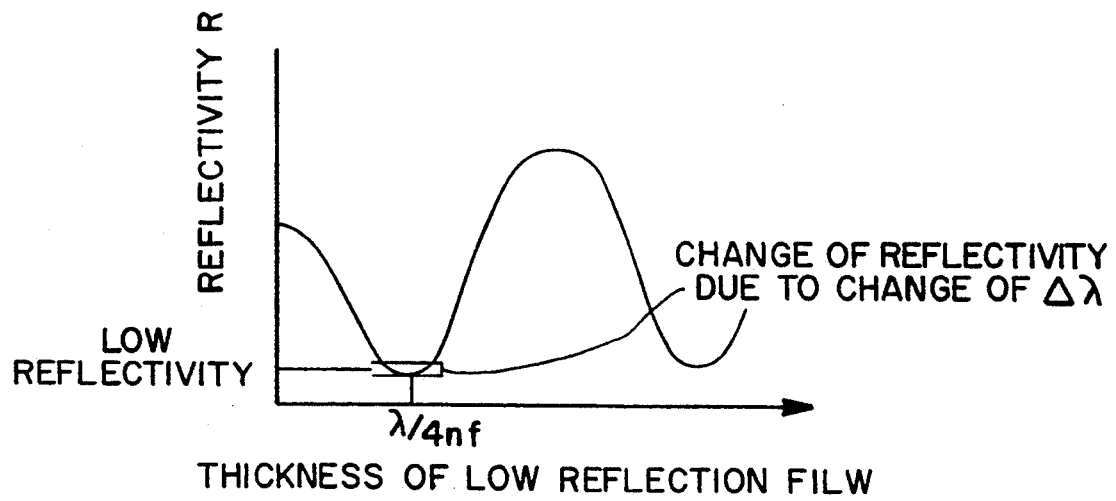
Figure 8:
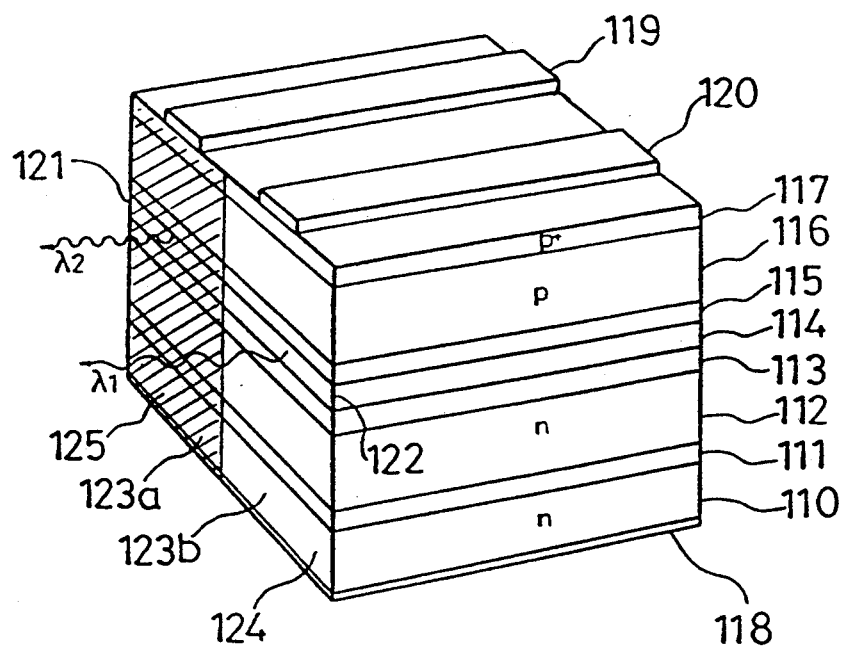
FIGS. 8, 9, 10, 11, 12, 13, 14(a), 14(b) and 14(c) are diagrams showing prior art semiconductor laser devices.
Figure 9:
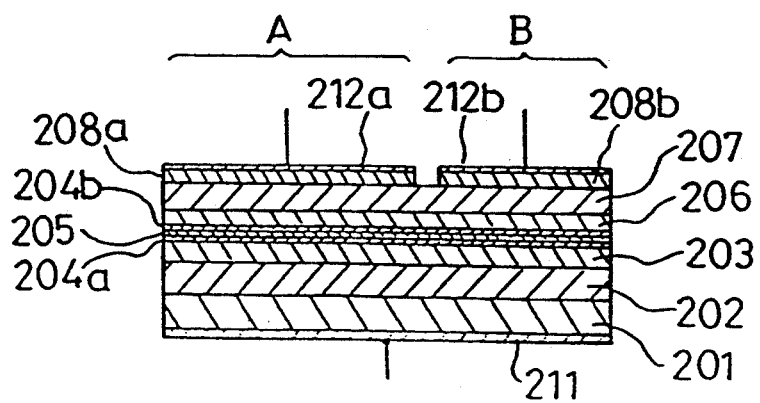
Figure 10:
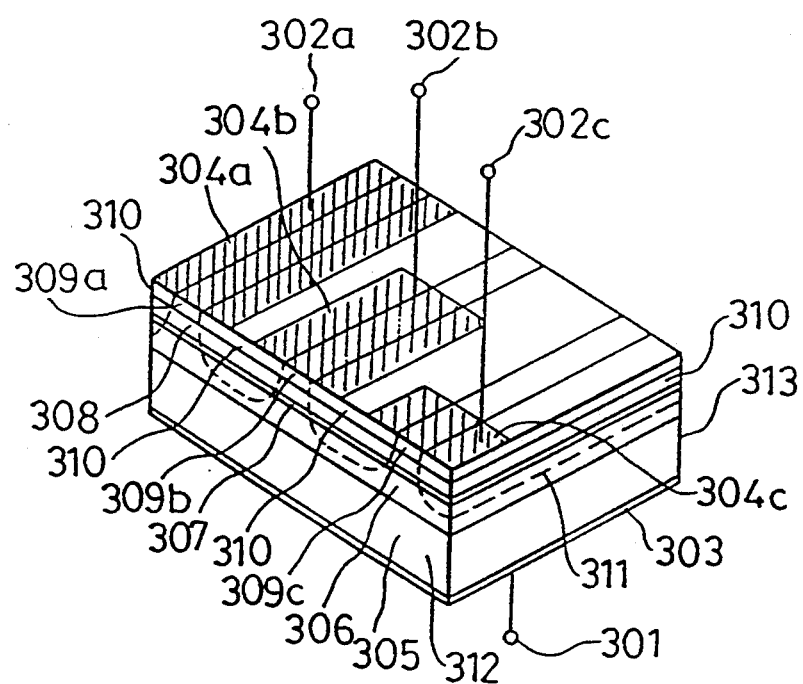
Figure 11:
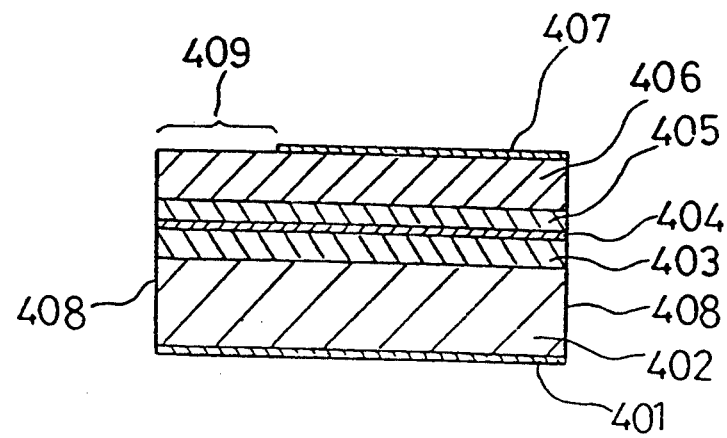
Figure 12:
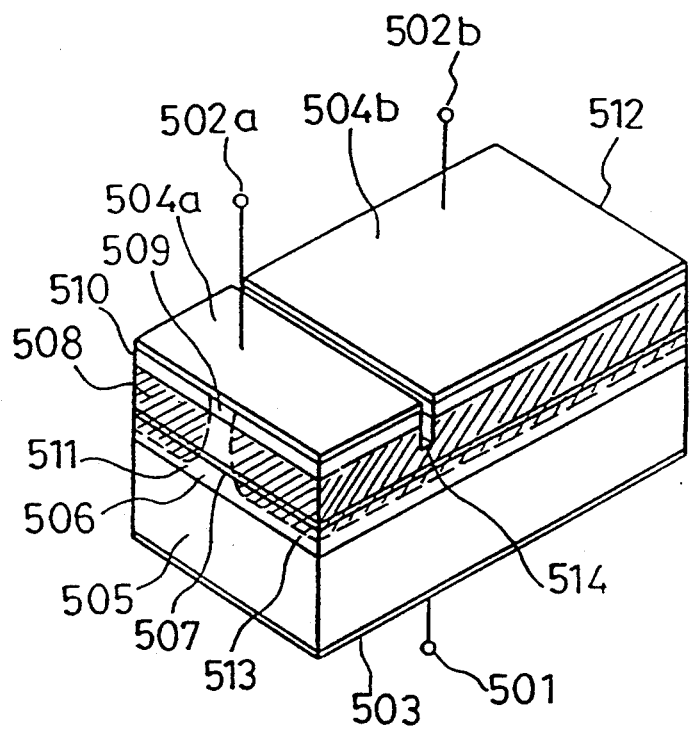
Figure 13:
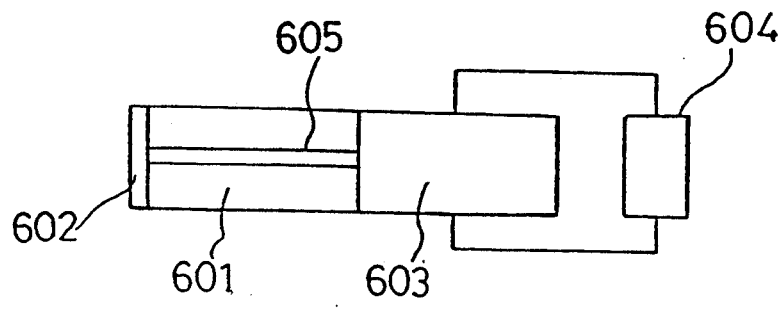
Figure 14A:
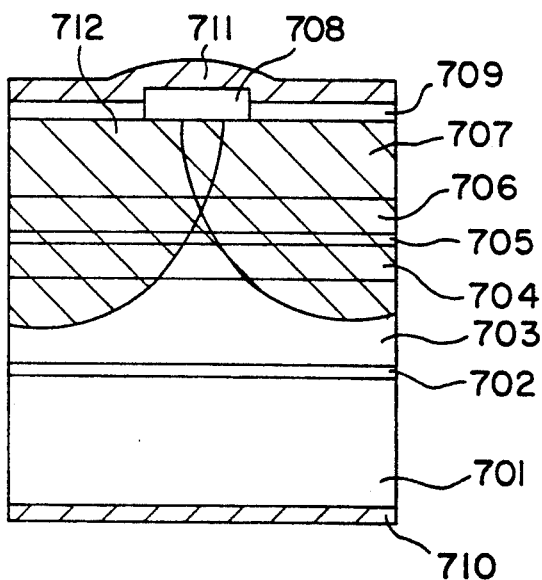
Figure 14B:
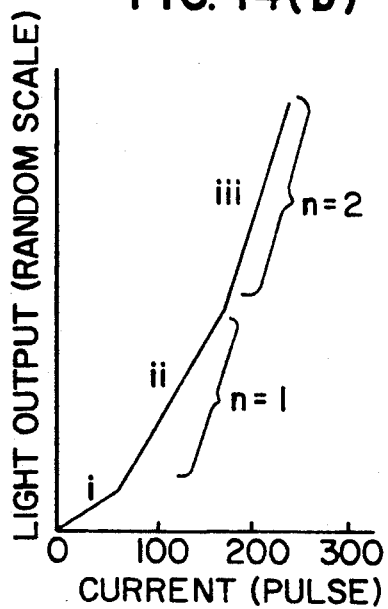
Figure 14C:
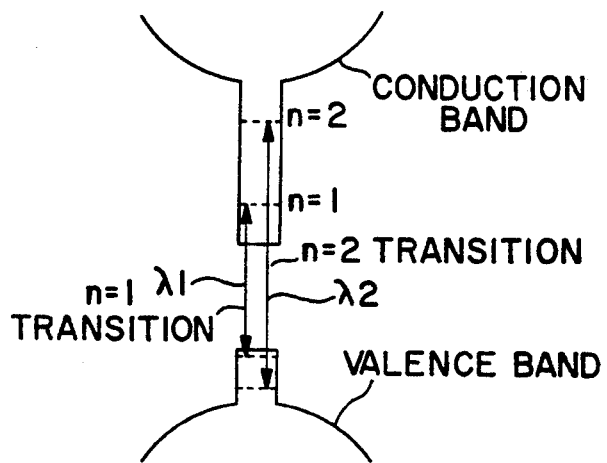

According to geometrical optics, when a substance of refractive index $\sqrt{n_m}$ having a thickness of $\lambda/4$ $n_m$ is arranged between a semiconductor or dielectric substance of refractive index $n_m$ and air, reflection of light of wavelength $\lambda$ is eliminated. Therefore, the structure shown in FIG. 7(a) in which materials $41a$ and $41b$ of refractive index $n_f (= \sqrt{n_m})$ having a thickness of $\lambda/4n_f$ are arranged as low reflection films on the both sides of the semiconductor or dielectric substance 40 are non-reflecting film for wavelength $\lambda$. However, since it is difficult to obtain a material of reflectivity $n_f = \sqrt{n_m}$ practically, not a perfect non reflection film but a low reflectivity film close to non-reflecting is obtained. This low reflectivity film does not change in reflectivity significantly when the wavelength $\lambda$ changes from the wavelength of quantum level of n=1 to the wavelength of quantum level of n=2, change of several tens of nm. Therefore, this structure has no wavelength selectivity.

When carriers are injected or an electric field is applied to the semiconductor or dielectric substance, the refractive index of the semiconductor or dielectric substance changes from $n_m$ to $n_m + \Delta n_m$. The reflectivity R of the structure shown in FIG. 7(a) at this state is given by the following formula.

$$R = \left| \frac{\frac{n_m + \Delta n_m}{n_f} - n_f}{\frac{n_m + \Delta n_m}{n_f} + n_f} \right|^2 \quad (4)$$

The change in refractive index as a function of the quantity of injected carriers ($\Delta n_m/\Delta N$, $\Delta N$: the quantity of injected carriers) is $-4.0 \times 10^{-21}$ cm$^3$ in the case of AlGaAs.

In the structure of FIG. 5, when $Al_xGa_{1-x}As$ (x=0.1) is used for the semiconductor plate 9, $n_m$=3.52. When the quantity of injected carriers is $1 \times 10^{20}$ cm$^3$, $\Delta n_m = -0.4$. Furthermore, when $Zr_2O_3$ of refractive index 2.2 is used for the low reflecting film, the reflectivity for that carrier injection is 4.8%, which is about twice as high as the reflectivity 2.5% obtained when carriers are not injected. This is an example and it is possible to change the reflectivity significantly by selecting materials and the injection carrier quantity.

In the above embodiment, the reflecting mirror element, comprising the semiconductor plate 9 and the low reflectivity films $10a$ and $10b$, separated from the laser element 1, is arranged in the neighborhood of the facet of the laser element 1, and the refractive index of the reflecting mirror element is varied by controlling the quantity of carriers injected into the semiconductor plate 9, thereby to change the reflectivity of the reflecting mirror element. Therefore, the mirror loss of the laser can be controlled and oscillation of the quantum well laser at different quantum levels is obtained. In addition, since the switching of the wavelength is performed by carrier injection in the reflecting mirror element which is separated from the laser element, quite high speed switching characteristics are obtained.

In the above-described embodiment, a reflecting mirror element which becomes non-reflecting or of low reflectivity when carriers are injected thereto is used, a reflecting mirror element which becomes non-reflecting or of low reflectivity when carriers are not injected can be used with the same effect as described above.

Figure 6:
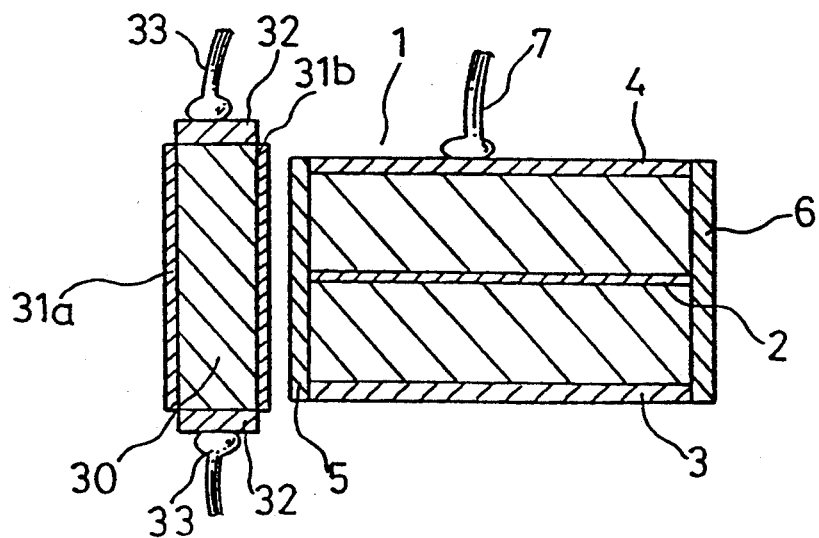
FIG. 6 is a perspective view showing an alternative of the second embodiment of the present invention.

FIG. 6 shows a semiconductor laser device as an alternative of the second embodiment of the present invention. This embodiment utilizes the change in refractive index owing to the electro-optic effect in order to change reflectivity. In FIG. 6, the same reference numerals as those shown in FIG. 5 designate the same or corresponding parts. The front facet and the rear facet of the semiconductor element 1 are asymmetrically coated by the low reflectivity film 5 and the high reflectivity film 6, respectively. A semiconductor or dielectric substance 30 exhibiting the electro-optic effect has anti-reflectivity films or low reflecting films 31a and 31b applied to both surface so as to make the semiconductor or dielectric substance 30 non-reflecting or low reflectivity when an electric field is not applied and is disposed in the neighborhood of the low reflectivity film 5 of the semiconductor element 1.

In this embodiment, the refractive index of the semiconductor or dielectric substance 30 is varied not due to carrier injection but due to the electro-optic effect by application of an electric field. However, the principle of realizing the multiple wavelength oscillation is totally the same. That is, when an electric field is not applied to the semiconductor or dielectric substance 30, the reflecting mirror element comprising low reflectivity films 31a and 31b and the semiconductor or dielectric substance 30 becomes non-reflecting or of low reflectivity and, therefore, the laser oscillates at the state of n=2. When an electric field is applied, the refractive index of the semiconductor or dielectric substance 30 changes and the reflectivity increases, thereby producing an oscillation for the state of n=1. Since the switching of the wavelength is performed by an application of an electric field, quite high speed switching characteristics can be obtained similarly as in the embodiment of FIG. 5.

While in the above-described embodiment a reflecting mirror element which becomes non-reflecting or of low reflectivity when an electric field is not applied thereto is used, a reflecting mirror element which becomes non-reflecting or of low reflectivity when an electric field is applied thereto can be used with the same effects as described above.

In addition, when the semiconductor laser element has up to i (>2)th quantum levels, it is possible to obtain oscillations up to i-th levels by changing the amplitude of the electric field applied to the semiconductor or dielectric substance.

As is evident from the foregoing description, according to an aspect of the present invention, a semiconductor laser device includes a semiconductor laser element having a quantum well or multi-quantum well active layer having n levels of quantum states, in which the front facet reflectivity and the rear facet reflectivity are asymmetrical or low so that an oscillation occurs at the n-th quantum level, a reflecting mirror having a reflectivity which enables oscillation of the semiconductor element at a quantum level lower than the n-th quantum level, and a reflecting mirror moving means for varying the oscillation wavelength of the semiconductor laser element by arranging the reflecting mirror in the neighborhood of the front facet or rear facet of the semiconductor laser element. Therefore, a semiconductor laser device which oscillates at two or more wavelengths with quite a simple construction can be realized.

According to another aspect of the present invention, a semiconductor laser device includes a semiconductor laser element having a quantum well or multi-quantum well active layer having n levels of quantum states, in which the front facet reflectivity and the rear facet reflectivity are made asymmetrical or low so that oscillation occurs at the n-th quantum level, a reflecting mirror element comprising a material the refractive index of which varies in response to the injection of carriers or the application of an electric field arranged in the neighborhood of the front facet or rear facet of the semiconductor laser element, the reflectivity of which varies by the variation in the refractive index, and the oscillation wavelength of the semiconductor laser element is varied by varying the reflectivity of the reflection mirror. Therefore, it is possible to obtain oscillations at two or more wavelengths by a simple construction and these wavelengths can be switched at quite a high speed.

What is claimed is:

1. A semiconductor laser device comprising:
   a semiconductor laser element having an active layer comprising a quantum well structure having n energy levels, where n≧2, from a first quantum level to an n-th quantum level and opposed front and rear facets having respective reflectivities, the front facet reflectivity and the rear facet reflectivity being asymmetrical so that oscillation can occur at the n-th quantum level; and
   a reflecting mirror element comprising a material having a refractive index that varies with injection of charge carriers into said material, for altering the reflectivity at one of said front and rear facets and disposed opposite one of said front and rear facets, said semiconductor laser element oscillating at an arbitrary quantum level from the first quantum level to the n-th quantum level.

2. A semiconductor laser device in accordance with claim 1 wherein said reflecting mirror element comprises:
   a semiconductor plate having a refractive index that varies in response to charge carrier injection into said plate;
   means for injecting charge carriers into said semiconductor plate; and
   anti-reflection film coatings disposed on two opposed surfaces of said semiconductor plate.

3. A semiconductor laser device in accordance with claim 2 wherein said anti-reflection film coatings give said reflecting mirror element low reflectivity when carriers are injected thereto.

4. A semiconductor laser device in accordance with claim 2 wherein said anti-reflection film coatings give said reflecting mirror element low reflectivity when no carriers are injected thereto.

5. A semiconductor laser device comprising:

a semiconductor laser element having an active layer comprising a quantum well structure having n energy levels, where n≧2, from a first quantum level to an n-th quantum level and opposed front and rear facets having respective reflectivities, the front facet reflectivity and the rear facet reflectivity being asymmetrical so that oscillation can occur at the n-th quantum level; and a reflecting mirror element comprising a material having a refractive index that varies with application of an electric field to said material, for altering the reflectivity at one of said front and rear facets and disposed opposite one of said front and rear facets, said semiconductor laser element oscillating at an arbitrary quantum level from the first quantum level to the n-th quantum level.

6. A semiconductor laser device in accordance with claim 5 wherein said reflecting mirror element comprises:

a semiconductor plate having a refractive index that varies in response to application of an electric field to said plate;

means for applying an electric field to said semiconductor plate; and anti-reflection film coatings disposed on two opposed surfaces of said semiconductor plate.

7. A semiconductor laser device in accordance with claim 6 wherein said anti-reflection film coatings give said reflecting mirror element low reflectivity when an electric field is applied thereto.

8. A semiconductor laser device in accordance with claim 6 wherein said anti-reflection film coatings give said reflecting mirror element low reflectivity when no electric field is applied thereto.

* * * * *